United States Patent [19]
Hollenbeck et al.

[11] Patent Number: 6,161,215
[45] Date of Patent: Dec. 12, 2000

[54] PACKAGE ROUTING OF INTEGRATED CIRCUIT SIGNALS

[75] Inventors: David B. Hollenbeck, Fort Collins; William S. Worley, Jr., Denver; David W. Quint; Timothy L. Michalka, both of Fort Collins, all of Colo.

[73] Assignee: Hewlett-Packard Company, Palo Alto, Calif.

[21] Appl. No.: 09/144,299

[22] Filed: Aug. 31, 1998

[51] Int. Cl.[7] .................................................... G06F 17/50
[52] U.S. Cl. .............................................. 716/15; 716/13
[58] Field of Search ....... 716/1–21; 395/500.02–500.19

[56] References Cited

U.S. PATENT DOCUMENTS

| | | | |
|---|---|---|---|
| 5,500,804 | 3/1996 | Honsinger et al. | 716/16 |
| 5,644,500 | 7/1997 | Miura et al. | 716/8 |
| 5,741,729 | 4/1998 | Selna | 438/125 |
| 5,757,656 | 5/1998 | Hershberger et al. | 716/13 |
| 6,028,986 | 2/2000 | Song | 716/1 |

OTHER PUBLICATIONS

Zhu et al., ("Package Clock Distribution Design Optimization for High–Speed and Low–Power VLSI's", IEEE Transactions on Components, Packaging, and Manufacturing Technology, Part B, vol. 20, No. 1, Feb. 1997, pp. 1–8).
Arledge et al. ("Scaling and performance implications for power supply and other signal routing constraints imposed by I/O pad limitations", 1998 IEEE Symposium on IC/Package Design Integration, Feb. 2, 1998, pp. 45–50).
"Chip and Package Co–Design Technique for Clock Networks," IEEE Multi–Chip Module Conference MCMC '96, Feb. 6–7, 1996, p. 160–163, by Qing Zhu and Wayne Wei–Ming Dai.
"Planar Clock Routing for High Performance Chip and Package Co–Design," IEEE Transactions On Very Large Scale Integration (VLSI) Systems, vol. 4, No. 2, Jun. 1996, p. 210–226, by Qing Zhu and Wayne Wei–Ming Dai.
"Package Clock Distribution Design Optimization for High–Speed and Low–Power VLSI's," IEEE Transactions On Components, Packaging, and Manufacturing Technology, Part B, vol. 20, No. 1, Feb. 1997, p. 1–8, by Qing Zhu and Simon Tam.

*Primary Examiner*—Paul R. Lintz
*Assistant Examiner*—Phallaka Kik

[57] ABSTRACT

Signal delay and skew within an integrated circuit are minimized when 1) signals are distributed to distant points of an integrated circuit via a layer of its package, and 2) traces in the package layer are etched and treated as transmission lines. As disclosed herein, a signal is driven through a first connection between an integrated circuit and an integrated circuit package layer. The signal is then distributed to one or more additional connections between the integrated circuit and the integrated circuit package layer, by means of point-to-point transmission lines formed in the integrated circuit package layer, each of the transmission lines being terminated at one or both ends by impedances which are substantially matched to the characteristic impedance of the transmission line to which they are attached. The signal is then received into the integrated circuit through the one or more additional connections between the integrated circuit and the integrated circuit package layer.

23 Claims, 6 Drawing Sheets

PACKAGE ROUTING OF INTEGRATED CIRCUIT SIGNALS

FIELD OF THE INVENTION

The invention pertains to the distribution of integrated circuit signals via an integrated circuit package layer. By distributing timing critical signals via an integrated circuit package layer, wire delay and signal skew are minimized.

BACKGROUND OF THE INVENTION

As integrated circuits become increasingly larger and more integrated, wire delay becomes one of the dominant factors in determining an integrated circuit's maximum operating frequency. Wire delay has a snowball effect in retarding an integrated circuit's operating frequency. Not only is an integrated circuit's operating frequency reduced as it takes longer for signals to travel from point A to point B, but when signals are transmitted from point A to points B and C, the variable nature of wire delay can lead to skew between copies of signals received at points B and C. To insure that this sort of skew does not lead to improper circuit operation, additional delay, for the purpose of alleviating skew between copies of a signal, must be built into a circuit.

Unfortunately, wire delay is highly dependent on manufacturing process and environmental variations, and integrated circuits must therefore be designed to function under a "worst case" wiring scenario. As a result, there exists a need for methods and apparatus which mitigate and/or eliminate wire delay as one of the dominant factors in determining an integrated circuit's maximum operating frequency.

Prior to the availability of area connections between an integrated circuit and its package (e.g., C4 solder bump technology), the only feasible way to distribute timing critical signals (e.g., clocks) was via the metal layers of the integrated circuit's fabrication technology.

Unfortunately, there are numerous contributors to wire delay and skew "on-chip". One source of delay and skew is routing mismatch. Routing mismatch encompasses factors such as non-ideal route lengths, topological differences, coupling differences, and process and temperature variations. For example, variations in ILD (inter-layer dielectric) thickness are a significant contributor to signal skew. Another source of delay and skew is repeater mismatch. Repeater mismatch encompasses factors such as non-ideal repeater placement, FET (field-effect transistor) mismatch, across die variations in temperature, and local power supply differences. Differences in local signal loading are also a significant contributor to signal delay and skew.

Now that area connections between an integrated circuit and its package are available, attempts have been made to move timing critical signal distribution networks onto an integrated circuit's package. For example, Zhu and Dai propose a package clock distribution scheme in a paper entitled "Chip and Package Co-Design Technique for Clock Networks", which was presented at the 1996 IEEE Multi-Chip Module Conference (Feb. 6–7, 1996), and in a paper entitled "Planar Clock Routing for High Performance Chip and Package Co-Design", which was published in IEEE Transactions on Very Large Scale Integration (Vol. 4, No. 2, June 1996). Package clock distribution is further discussed by Zhu and Tam in a paper entitled "Package Clock Distribution Design Optimization for High-Speed and Low-Power VLSI's", which was published in IEEE Transactions on Components, Packaging, and Manufacturing Technology (Part B., Vol. 20, No. 1, February 1997). So that a complete background of package signal distribution need not be restated herein, these papers are hereby incorporated by reference for all that they disclose.

Theoretically, the distribution of timing critical signals via an integrated circuit package layer should mitigate the differences seen between copies of the signals received at remote corners of an integrated circuit, thus enabling a higher frequency of operation for the integrated circuit, and therefore, higher performance for a given integrated circuit fabrication technology. There are many factors which support this "theoretical" advantage. First, package wiring has less resistance than on-chip wiring. While package wiring is typically formed of copper, on-chip wiring is typically formed of an aluminum alloy. Furthermore, package wires can be made wider and thicker than on-chip wires (and thus, the resistance associated with package wiring may be further reduced).

An additional advantage of package wiring is that on-chip metal utilization is reduced. As a result, a smaller die size and/or fewer layers of metal may be used in an integrated circuit fabrication process, and signal delay and skew may be further reduced (if the die is smaller, signals do not have to travel as far). Alternatively, on-chip area which is freed by moving signal routes to the package can be used for added functionality (e.g., larger caches, additional functional units, etc.).

Yet another advantage of package wiring is that there are fewer sources of signal skew on-package. Similarly to on-chip signal routes, skew caused by routing mismatch still exists (e.g., non-ideal route lengths, ILD variations, etc.). However, many sources of routing skew are reduced. For example, skew induced by manufacturing process variation is far less, and skew attributable to repeater mismatch is eliminated (since repeaters are not used in conjunction with package wiring).

However, in spite of these "theoretical" advantages, many of them have yet to be realized, or have not been realized to their full extent. Most importantly, package signal distribution has yet to offer significantly faster signal distribution. Nor has package signal distribution resulted in a significantly better signal (e.g., a faster clock, with less skew, better edges, etc.).

It is therefore a first object of this invention to provide improved methods and apparatus for package signal distribution, wherein timing critical signals such as clocks may be distributed to distant locations of an integrated circuit with less delay and skew.

Another object of this invention is to provide methods and apparatus which free on-chip area for added functionality (and/or use of a smaller die).

Yet another object of this invention is to provide methods and apparatus which can be implemented utilizing existing manufacturing technologies and integrated circuit fabrication processes.

SUMMARY OF THE INVENTION

To achieve the foregoing and additional objects of the invention, the inventors have devised new methods and apparatus for distributing timing critical signals via an integrated circuit package layer.

Previous package distribution schemes have merely moved existing global, on-chip wiring networks to a package layer to capitalize on the lower resistance of a package layer (which as previously stated, is usually formed of copper, and provides room for wider and thicker traces).

These existing networks have comprised balanced RC networks, such as balanced H-tree networks. In an RC network, delay through the network is proportional to the resistance and capacitance of the network, or approximately, $$R_{wire} *(C_{wire}+C_{load})$$

However, while correctly presuming that $R_{wire}$ on-package is approximately three orders of magnitude less than $R_{wire}$ on-chip, previous package distribution schemes have presumed that the receiving end of a package route (e.g., the ESD protection circuit) sees an inordinately large capacitance ($C_{load}$). However, the inventors have proved this presumption to be incorrect. While past package distribution schemes have presumed $C_{load}$ to be on the order of 5 pF, the load capacitance actually seen by a receiver's ESD resistor is on the order of 0.05 pF (which is an additional two orders of magnitude less than that presumed by Zhu and Tam). This being the case, both the R and C components of the above equation are very low on-package, and a package distribution system is best constructed as a plurality of point-to-point transmission lines, rather than a balanced RC network such as an H-tree.

When package signal routes are constructed as point-to-point transmission lines, manufacturing and environmental variations for the package layer have a considerably lesser effect on signal delay and skew (in contrast to on-chip, where manufacturing and environmental variations have a significant impact on delay and skew).

Furthermore, delay and skew for signals carried over a package layer transmission line are primarily determined by the relative permittivity of the dielectric surrounding the transmission line, and are largely independent of manufacturing variability.

Driver/receiver mismatches "on package" add an additional component of skew to signals routed via a package layer, as does the need for ESD protection of on-chip receiver circuits. However, these added skew components are more than offset by the absence of skew induced by repeater mismatch.

Point-to-point signal routes in a package layer must be properly terminated to prevent signal reflection. Otherwise, signal reflections can so degrade the quality of a signal that it becomes difficult to determine if and when a signal has switched. In a package layer, where resistive and capacitive effects are very low, signal reflection is a significant problem. However, signal reflection can be controlled by terminating at least one end of each point-to-point transmission line with an impedance which is substantially matched to the characteristic impedance of the transmission line.

Once a signal has been globally distributed via a package layer, it may then be locally distributed in a more conventional manner (e.g., via an on-chip RC network such as an H-tree), but over a significantly reduced on-chip area.

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawings in which.

DESCRIPTION OF THE PREFERRED EMBODIMENT

Figure 10:
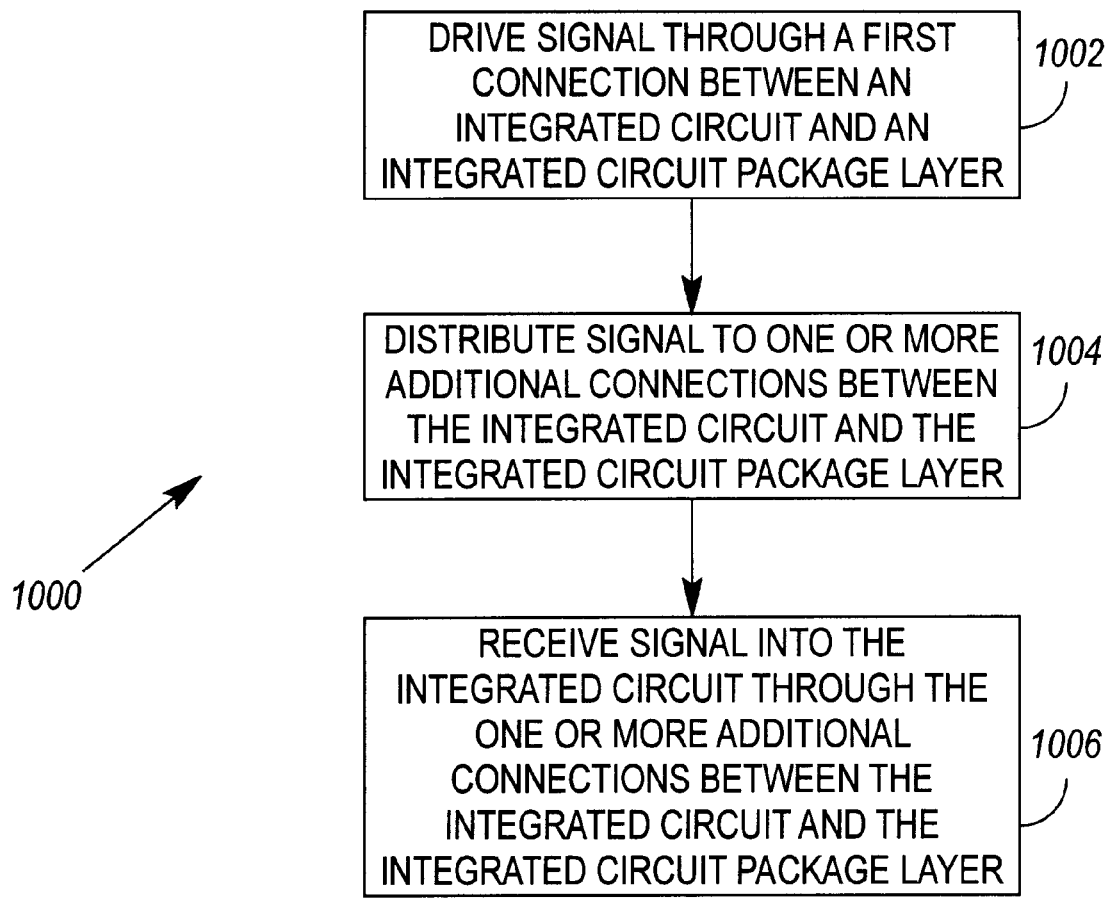
FIG. 10 is a flow chart of a method for reducing signal delay and skew in an integrated circuit.

A method 1000 of reducing signal delay and skew in an integrated circuit is illustrated in FIG. 10, and may generally comprise driving 1002 a signal through a first connection between an integrated circuit and an integrated circuit package layer; distributing 1004 the signal to one or more additional connections between the integrated circuit and the integrated circuit package layer, by means of point-to-point transmission lines formed in the integrated circuit package layer; and receiving 1006 the signal into the integrated circuit through the one or more additional connections between the integrated circuit and the integrated circuit package layer.

Apparatus for implementing such a method is illustrated in FIGS. 1–6 & 8, and may generally comprise an integrated circuit package 100 (FIG. 1) and an integrated circuit 200 (FIG. 2) mounted interior to the integrated circuit package 100. The integrated circuit package 100 comprises a package layer 404 (FIG. 4) with one or more transmission lines 618–664, 818 (FIGS. 5, 6 & 8) formed therein. A first end 834 (FIG. 8) of each transmission line 818 is coupled to a driver circuit 806 (possibly a driver circuit common to more than one transmission line) located within the integrated circuit 200. A second end 836 of each transmission line 818 is coupled to a receiver circuit 832 located within the integrated circuit 200 (each transmission line being coupled to a different receiver circuit). Each transmission line 818 is properly terminated with a termination impedance connected to one or both ends 834, 836 of the transmission line 818.

As used in this description, the term "properly terminated" means that a transmission line is terminated at one or both ends (using source and/or load termination), to reduce the possibility of reflection in the transmission line to a level which is acceptable for a given application. Typically, a termination impedance 840 will be substantially matched to the characteristic impedance of a transmission line 818. As used in this description, terms such as "substantially matched" and "substantially equal" mean that two elements being compared are equivalent, but for manufacturing and other unintended variances.

Having described methods 1000 and apparatus for reducing signal delay and skew in general, the methods 1000 and apparatus will now be described in further detail.

Figure 1:
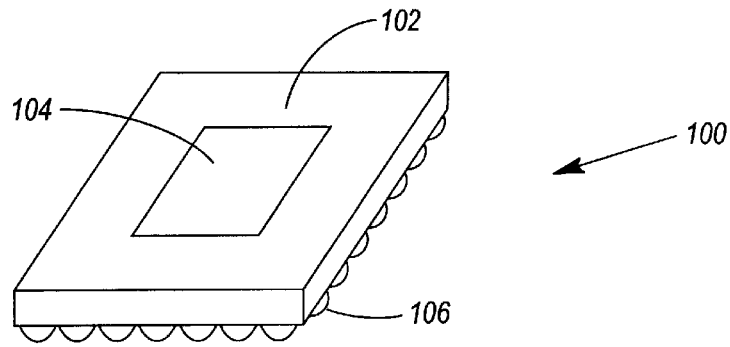
FIG. 1 is a perspective view of an integrated circuit package.
Figure 2:
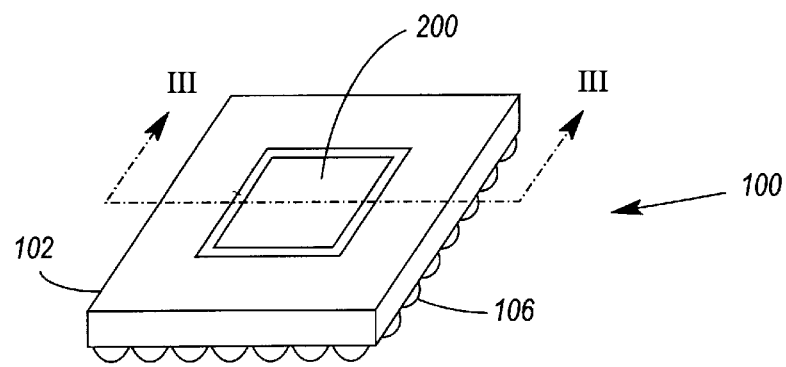
FIG. 2 is a perspective view of the FIG. 1 integrated circuit package, its cap being removed to reveal an integrated circuit mounted within its base.

FIG. 1 illustrates an exemplary integrated circuit package 100. A ball grid array 106 formed on the underside of the integrated circuit package 100 provides a means for electrically coupling an integrated circuit 200 (a "chip"; FIG. 2) mounted interior to the package 100 to a printed circuit board. As known in the art, the ball grid array 106 illustrated in FIG. 1 is only one example of a means for electrically coupling an integrated circuit to a printed circuit board. Other means comprise pins, edge connectors, and the like.

Figure 3:
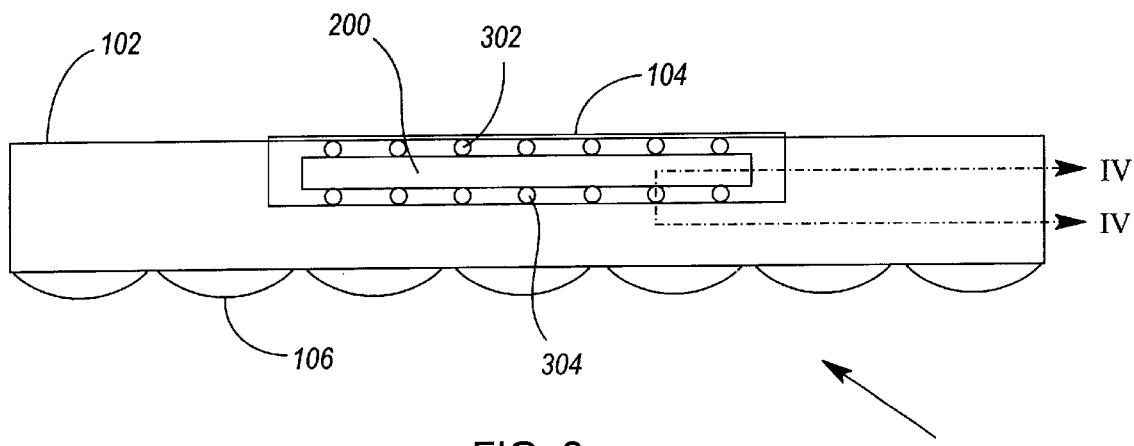
FIG. 3 is a cross-sectional view of connections between the integrated circuit and package base illustrated in FIGS. 1 and 2.

An integrated circuit package 100 may be constructed in a variety of ways. In FIGS. 1–3, the integrated circuit package 100 illustrated therein comprises a base 102 and a cap 104. In FIG. 2, the cap 104 has been removed to reveal a chip 200 mounted within the integrated circuit package's base 102.

FIG. 3 illustrates a cross-section 300 of the apparatus illustrated in FIG. 1. In FIG. 3, area connections 302, 304 between the chip 200 and its package 102, 104 are shown. Area connections 302, 304 may comprise C4 solder bumps, for example, which when heated form a connection 302, 304 between a chip 200 and its package 102, 104. C4 solder bumps 302, 304 may exist on either surface of a chip 200, and may interconnect a chip 200 with either a printed circuit board (e.g., via solder bumps of a ball grid array 106), or alternatively, may interconnect a chip 200 with layers of material existing internal to a package (e.g., layers in the base 102 or cap 104 of a package 100).

Although FIG. 3 illustrates a chip 200 having area connections 302, 304 to its package 100, it is possible that a chip 200 may be connected to its package 100 via area 302 and/or other connections. For example, a chip 200 might be connected to its package 100 via fine wires bonded between pads on the chip 200, and pads on the package 102.

Figure 4:
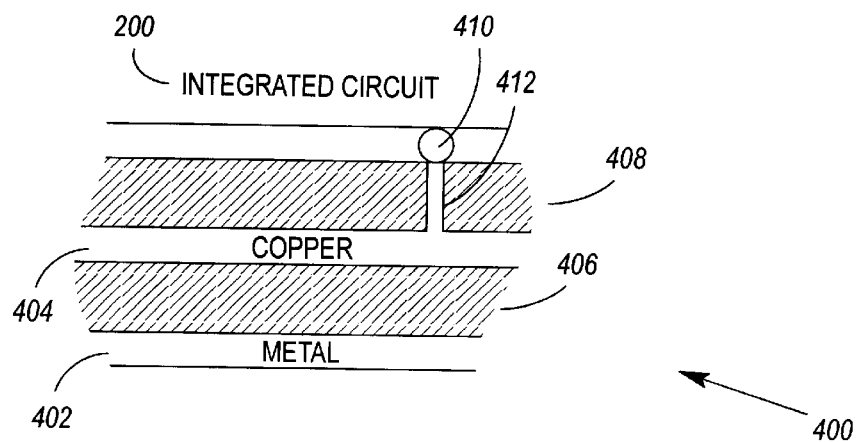
FIG. 4 is an enlarged cross-sectional view of the integrated circuit package base illustrated in FIG. 3.

FIG. 4 illustrates exemplary layers 402, 404, 406, 408 within the integrated circuit package of FIGS. 1–3 in more detail. These package layers comprise a metal layer 402, a first dielectric layer 406, a copper layer 404, and a second dielectric layer 408. FIG. 4 is only illustrative of the layers which may exist in an integrated circuit package 200, and more or fewer layers may actually exist. Interconnections between layers, or between a layer 404 and an integrated circuit 200, may be formed by creating vias 412 in an intermediate layer 408, and allowing material of a first layer 404 (e.g., copper) to flow through a via 412 so as to make contact with a second layer (e.g., a C4 solder bump 410 on an integrated circuit chip 200). In this manner, signals interior to a chip 200 may be driven into a layer 404 of the chip's package, and distributed to one or more distant locations on the chip 200.

As previously discussed, one reason to route signals "off-chip" is to take advantage of lower off-chip resistances. While metal layers on-chip often comprise aluminum alloy traces, metal layers off-chip may comprise copper traces; and copper is a much better conductor than aluminum alloy (approximately 2–3 times better). However, a problem with past implementations of off-chip clock distribution networks is that those who have implemented such distribution schemes have treated the off-chip clock distribution network as an RC network. While previous off-chip clock distribution networks have been fabricated under the presumption that package layer resistances are less than on-chip resistances, these networks have also been fabricated under the presumption that package layer capacitance is relatively substantial. In reality, it is not. An important aspect of realizing the theoretical advantages of package layer clock distribution is to design an off-chip clock distribution network under the presumptions that both package layer resistance and capacitance are low, and that $R<<\omega L$, and $R<<1/\omega C$.

If these presumptions are correct, then traces in a package layer are best constructed as point-to-point transmission lines rather than legs of an RC network. While H-tree distribution networks pose significant advantages when implemented within the RC environment of a chip (or any other RC environment), they pose a limiting factor when implemented in a package layer since they often create impedance discontinuities. These impedance discontinuities in turn lead to signal reflection, and thus skew.

Figure 5:
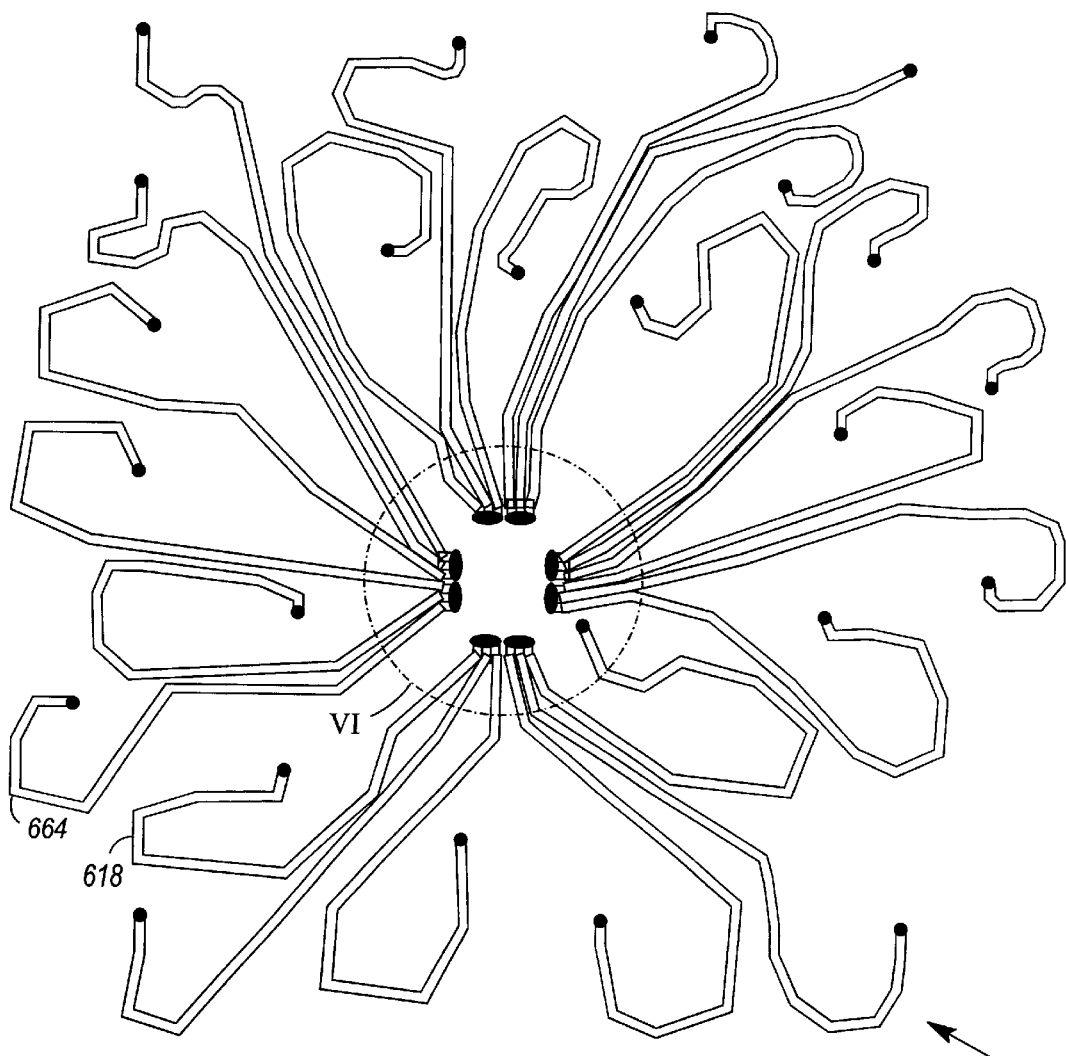
FIG. 5 is a plan view of an integrated circuit package layer having a number of transmission lines routed therein.
Figure 6:
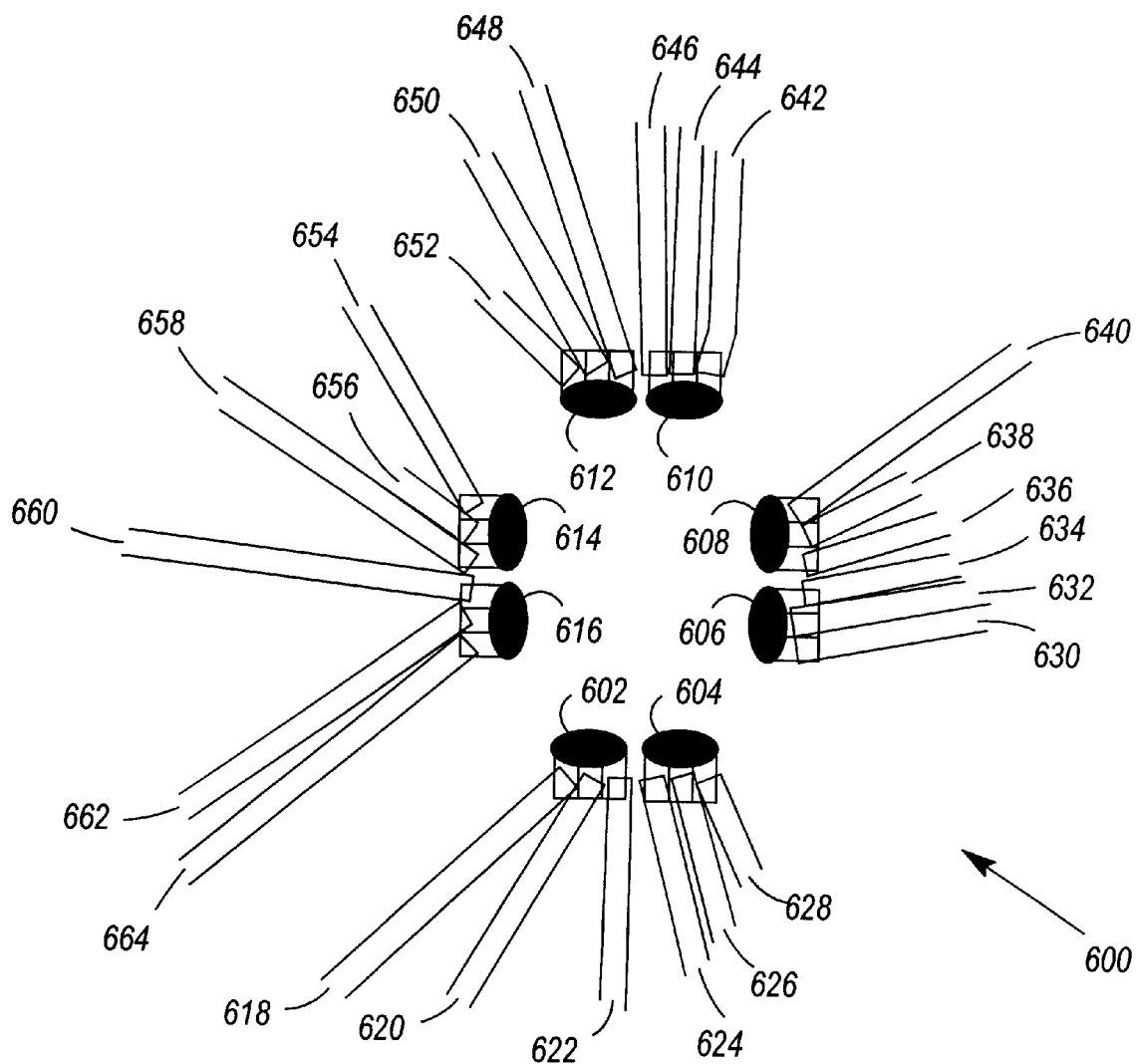
FIG. 6 is an enlarged view of the driver circuits of FIG. 5.

As a result, FIG. 5 illustrates an exemplary signal distribution scheme 500 for package signal distribution. Under a preferred distribution scheme, a common clock signal is driven off-chip by eight drivers 602–616 (FIG. 6). A plurality of drivers 602–616 are used so that the apparent impedance seen by each driver remains at a relatively high, constant level, and impedance matching with the receivers corresponding to a single driver is more precise.

Each driver 602–616 is of similar construction, and drives a clock signal onto three properly terminated point-to-point transmission lines (e.g., 618–622). Transmission lines may be formed in a package layer by an etching process, for example. Preferably, each transmission line 618–664 used for distributing a common signal is of substantially equal length and characteristic impedance. In this manner, each transmission line 618–664 propagates a clock signal wavefront 700 (FIG. 7A) with minimal degradation (e.g., skew) due to signal reflection. Although the transmission lines 618–664 illustrated in FIGS. 5 and 6 comprise "sharp" bends, it is preferred that bends in a transmission line be rounded to reduce the introduction of impedance discontinuities into the transmission line (in fact, transmission lines with fewer or no bends are even less likely to comprise impedance discontinuities—though practical routing requirements may limit, or even prevent, the use of such "bend-free" transmission lines).

Figure 7A:
FIG. 7A is a graph illustrating wavefront propagation.
Figure 7B:
FIG. 7B is a graph illustrating the effects of signal reflection on wavefront propagation.

FIGS. 7A and 7B illustrate why it is important to reduce signal reflection. FIG. 7A illustrates the waveform appearing at the receiving end of a properly terminated point-to-point transmission line, assuming that the driver of the transmission line induces a signal wavefront (indicative of a transition from logic "0" (GND) to logic "1" (VDD), or vice versa) at time A. At time B, shortly after time A, the signal wavefront arrives at the receiving end of the transmission line.

FIG. 7B illustrates the waveform appearing at a receiving end of either 1) a transmission line which has not been properly terminated, or 2) a leg of an H-tree network implemented in a medium with a very low RC constant. FIG. 7B assumes that at time A, the driver of the transmission line or H-tree network induces the same signal wavefront as in FIG. 7A. At time B, a fluctuation in voltage is seen at the receiving end of the H-tree network. However, due to reflections caused by branches in the H-tree network (or lack of proper termination), the receiving end does not receive a voltage in excess of $V_{TH}$ (the threshold voltage of the receiver), and the logic "1" transmitted by the driving end of the H-tree network is not recognized. At some time after time B, the signal received by the H-tree receiver may in fact rise above $V_{TH}$, but then fall below $V_{TH}$ before the H-tree receiver can recognize that a logic "1" has been sent. At some point (e.g., time C), the numerous signal reflections propagated through the network will subside, and a voltage in excess of $V_{TH}$ will be recognized by the receiver so that it will switch.

Mitigating signal reflection so as to propagate signal wavefronts (i.e., a signal with clean edges) through a package distribution network therefore provides for faster switching of receivers, and less delay within a package distribution network. Mitigating signal reflection also reduces the likelihood of skew between copies of a signal.

Figure 8:
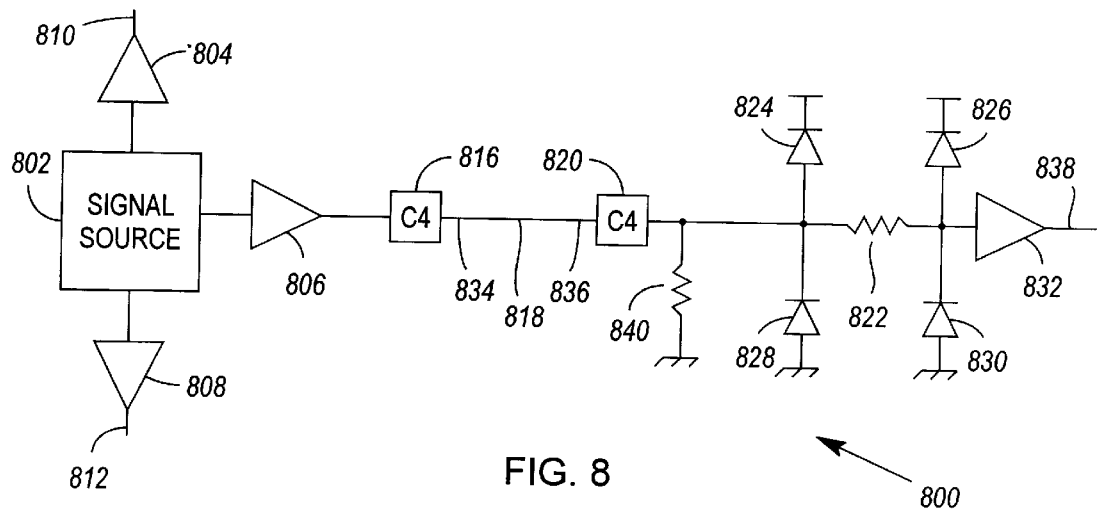
FIG. 8 is a schematic illustrating a driver circuit, a receiver circuit, a load termination impedance, and an ESD protection circuit connected to a single one of the FIG. 5 signal transmission lines.

The driver circuits 602–616 illustrated in FIG. 6 may be driven by a common signal source. FIG. 8 illustrates such an arrangement. If the signal source 802 is a clock source, it will most likely receive a system clock signal derived from an external clock source and provided to the internal clock source circuitry 802 via 1) a solder ball of a ball grid array, and then 2) a C4 solder bump (or other connection) between an integrated circuit 200 and its package 100.

Signal source 802 drives one or more driver circuits 804, 806, 808. Driver circuits are known in the art, and a specific driver implementation is beyond the scope of this disclosure. Each driver circuit 804–808 respectively drives one or a plurality of point-to-point transmission lines 810, 812, 818 by way of a C4 solder bump 816 connection (or wire or other connection means). The first 834 and/or second 836 end of each transmission line 818 is terminated by a characteristic impedance 840 (e.g., a 50Ω resistor) which is properly matched to the transmission line 818 (to thereby mitigate reflections in the line 818). Load termination is illustrated in FIG. 8. However, a circuit designer may choose to alternatively (or additionally) use source termination.

A signal transmitted over a transmission line 818 may be received back into an integrated circuit 200 by means of a second C4 solder bump 820, and may then be applied to the driver 832 of a local signal distribution network 838.

An important consideration to be taken into account during manufacture of a package routed clock or signal distribution network is the effect of electrostatic discharge (ESD). Electrostatic effects are most likely to pose a problem as an integrated circuit 200 is being mounted within and/or connected to its package 100. The receiving end 836 of the FIG. 8 transmission line 818 therefore incorporates ESD protection circuitry. Although not shown, similar ESD protection circuitry can be implemented in the driver circuitry 804–808 as well. The ESD protection circuitry shown in FIG. 8 comprises a number of clamp diodes 824–830 surrounding an ESD resistor 822. In a standard ESD configuration, two clamp diodes 824, 828 are respectively connected between one end of the ESD resistor 822 and either power or ground, and two clamp diodes 826, 830 are respectively connected between the other end of the ESD resistor 822 and either power or ground. In this manner, charges in excess of what local driver 832 can withstand are funneled off to a system ground or the like. Simulations have shown a value of 150Ω for the ESD resistor 822 to be beneficial. Although conventional package routing schemes teach that this high of a resistance 822 is inordinately large, and is likely to cause additional signal reflection and skew, this is not the case.

Figure 9:
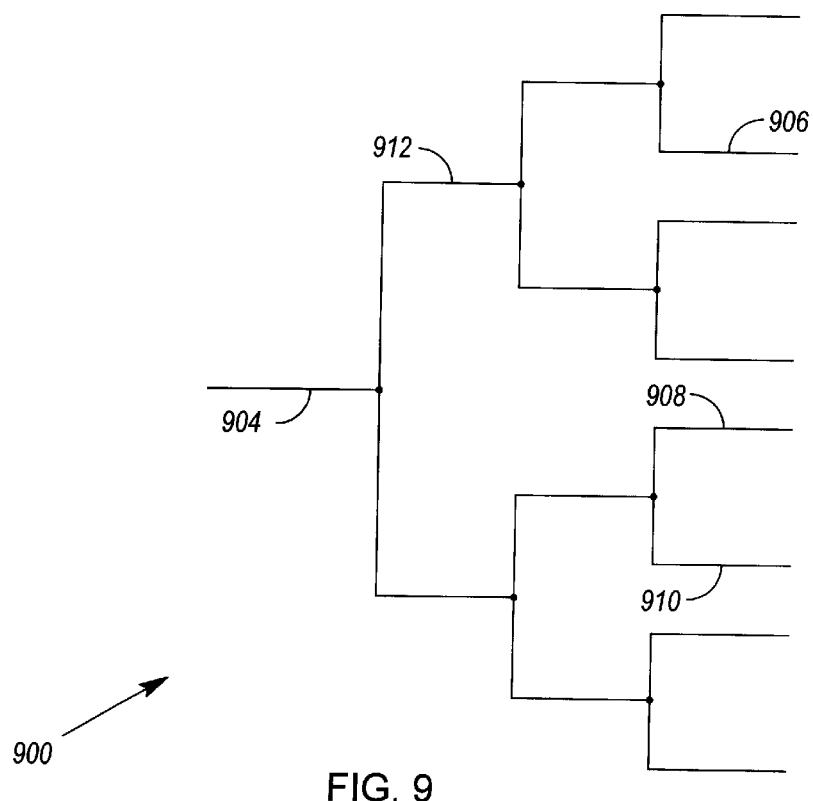
FIG. 9 is a schematic illustrating an H-tree distribution network which may be connected to the receiver circuit of FIG. 8.

FIG. 9 illustrates an H-tree distribution network 900 which can be used to drive package routed signals to additional integrated circuit locations. Preferably, global signal distribution is performed via the apparatus of FIGS. 5, 6 & 8, and local signal distribution is performed via the apparatus of FIG. 9. Line 904 of the FIG. 9 H-tree may be equivalent to, or driven by (either directly or indirectly), line 838 of FIG. 8. As is customary in an H-tree network, the lengths of lines extending between 904 and 906, 904 and 908, and 904 and 910 should be substantially equal.

Package signal distribution is advantageous over on-chip signal distribution, in part, because it provides a more uniform electrical environment, whereas an on-chip electrical environment is not substantially uniform. Package signal distribution further mitigates skew by the operation of properly designed transmission lines which reduce coupling to adjacent signals (e.g., differential transmission lines).

Using circuit simulation of a 0.18 micron integrated circuit process, tests have shown that when a signal is routed from a clock source to two substantially identical repeaters of an H-tree network via 6,000 μm×25 μm layer 5 metal wires, and then to two additional repeaters of the H-tree network via 7,500 μm×40 μm layer 6 metal wires (the additional repeaters again being substantially identical), and finally to two substantially identical receivers via 3,000 μm×20 μm layer 6 and 1,500 μm×10 μm layer 5 metal wires, copies of the signal appearing at the two receivers may be skewed by 100 ps. Using the same process, but routing the signal directly from the clock source to the two receivers via 16,000 μm×55 μm copper transmission lines in a package layer, copies of the signal appearing at the two receivers are skewed by only 20 ps.

Given the configurations of the above paragraph, the signal skew attributable to wire, repeater, driver, and ESD effects is as follows:

|  | Chip Route | Package Route |
| --- | --- | --- |
| Wire | 68 ps | 3 ps |
| Repeater | 36 ps | 0 ps |
| Driver | 0 ps | 4 ps |
| ESD | 0 ps | 13 ps |
| Total Skew | 104 ps | 20 ps |

While skew due to driver and ESD effects is found only in a package route, these skew elements are much less than repeater skew, and are entirely offset by the savings in wire and repeater derived skew.

Although the above description has been limited to a discussion of "point-to-point" transmission lines, it is within the scope of this invention that a receiving end of a transmission line may comprise a number of relatively short stubs. For example, a number of 1,000 μm stubs off of a 16–18,000 μm transmission line. Each stub should comprise proper termination and be matched to the length and characteristic impedance of other stubs. In utilizing stubs off of a transmission line, one may balance their desire to mitigate skew and delay with their needs to distribute copies of a timing critical signal to a greater number of locations. Regardless of whether stubs off of a transmission line are utilized, package signal distribution is treated as a transmission line environment rather than an RC environment.

While illustrative and presently preferred embodiments of the invention have been described in detail herein, it is to be understood that the inventive concepts may be otherwise variously embodied and employed, and that the appended claims are intended to be construed to include such variations, except as limited by the prior art. In the following claims, the article "a" should not be taken to mean "only one".

What is claimed is:

1. A method of reducing signal delay and skew in an integrated circuit, comprising:
   a) driving a signal through a first connection between an integrated circuit and an integrated circuit package layer;
   b) distributing the signal to a second connection between the integrated circuit and the integrated circuit package layer, by means of a transmission line formed in the integrated circuit package layer; and c) receiving the signal into the integrated circuit through the second connection between the integrated circuit and the integrated circuit package layer.

2. A method as in claim 1, further comprising distributing the signal to a plurality of additional connections between the integrated circuit and the integrated circuit package layer, wherein distribution to each of the additional connections is accomplished by means of a distinct additional transmission line formed in the integrated circuit package layer.

3. A method as in claim 2, further comprising distributing the signal interior to the integrated circuit by way of one or more distribution networks, each of said one or more distribution networks being coupled to one of the second and additional connections between the integrated circuit and the integrated circuit package layer.

4. A method as in claim 1, wherein the signal is a clock signal.

5. A method as in claim 1, wherein the transmission line is terminated at one or both ends by impedances which are substantially matched to the transmission line's characteristic impedance.

6. Apparatus, comprising:

a) an integrated circuit package comprising a package layer with a first transmission line formed therein;

b) an integrated circuit, connected to the integrated circuit package, comprising a first driver circuit and a first receiver circuit;

c) a first coupling, between a first end of the first transmission line and the first driver circuit; and d) a second coupling, between a second end of the first transmission line and the first receiver circuit.

7. Apparatus as in claim 6, wherein the first transmission line is terminated at one or both ends by impedances which are substantially matched to the first transmission line's characteristic impedance.

8. Apparatus as in claim 6, wherein the first driver circuit is a clock driver, and is connected to a clock source located within the integrated circuit.

9. Apparatus as in claim 8, further comprising a clock distribution network located within the integrated circuit, said clock distribution network being coupled to the first receiver circuit.

10. Apparatus as in claim 8, wherein the second coupling comprises an electrostatic discharge (ESD) protection circuit, and the ESD protection circuit comprises a number of clamp diodes and an ESD resistor coupled between the second end of the first transmission line and the first receiver circuit.

11. Apparatus as in claim 6, wherein each of the first and second couplings comprises a C4 solder bump connection.

12. Apparatus as in claim 6, wherein the first transmission line has a substantially uniform characteristic impedance.

13. Apparatus as in claim 6, wherein a capacitance load of the first receiver circuit is substantially less than capacitance of the first transmission line.

14. Apparatus as in claim 6, further comprising:

a) a plurality of additional transmission lines formed within the package layer;

b) a plurality of additional receiver circuits located within the integrated circuit;

c) first additional couplings, between first ends of a first subset of the plurality of additional transmission lines and the first driver circuit; and d) second additional couplings, between second ends of the first subset of the plurality of additional transmission lines and various ones of the plurality of additional receiver circuits.

15. Apparatus as in claim 14, wherein the first subset of the plurality of additional transmission lines comprises all of the plurality of additional transmission lines.

16. Apparatus as in claim 14, further comprising:

a) a plurality of additional driver circuits located within the integrated circuit; and b) third additional couplings between ends of additional subsets of the plurality of additional transmission lines and various ones of the plurality of additional driver circuits.

17. Apparatus as in claim 14, wherein the first and plurality of additional transmission lines are of substantially equal length.

18. Apparatus as in claim 14, wherein the first and plurality of additional transmission lines have substantially equal characteristic impedances.

19. Apparatus as in claim 16, wherein:

a) each driver circuit is a clock driver, and each clock driver is connected to a clock source located within the integrated circuit;

b) at least one end of each transmission line is coupled to a termination impedance which is substantially matched to a characteristic impedance of the transmission line to which it is attached;

c) each of the first, second, first additional, second additional, and third additional couplings comprises a C4 solder bump connection;

d) the first and plurality of additional transmission lines are of substantially equal length; and e) capacitance loads of each of the receiver circuits are significantly less than capacitances of the transmission lines to which they are coupled.

20. Apparatus as in claim 6, wherein the first transmission line is a differential transmission line.

21. Apparatus as in claim 6, wherein:

a) the second end of the first transmission line is one of a number of short stubs extending from said first transmission line; and b) the integrated circuit comprises a number of additional receiver circuits; the apparatus further comprising:

c) a number of additional couplings between additional ones of the number of short stubs and ones of the number of additional receiver circuits.

22. Apparatus, comprising:

a) an integrated circuit package, comprising a package layer with a transmission line formed therein;

b) an integrated circuit, connected to the integrated circuit package, comprising a receiver circuit;

c) a first coupling, between a first end of the transmission line and a driver circuit located exterior to the integrated circuit package; and d) a second coupling, between a second end of the transmission line and the receiver circuit; and e) a termination impedance coupled to one end of the transmission line, the termination impedance being substantially matched to the transmission line's characteristic impedance.

23. Apparatus as in claim 22, further comprising a second integrated circuit connected to a second integrated circuit package, the second integrated circuit comprising said driver circuit.

* * * * *